United States Patent

Ohno et al.

(10) Patent No.: US 7,436,065 B2
(45) Date of Patent: Oct. 14, 2008

(54) ELECTRODE CONTACT STRUCTURE

(75) Inventors: Seiji Ohno, Minato-ku (JP); Taku Kinoshita, Minato-ku (JP)

(73) Assignee: Fuji Xerox Co., Ltd., Tokyo (JP)

( * ) Notice: Subject to any disclaimer, the term of this patent is extended or adjusted under 35 U.S.C. 154(b) by 48 days.

(21) Appl. No.: 11/116,926

(22) Filed: Apr. 28, 2005

(65) Prior Publication Data

US 2006/0001171 A1    Jan. 5, 2006

(30) Foreign Application Priority Data

Apr. 28, 2004 (JP) ............................. 2004-132738
Feb. 2, 2005 (JP) ............................. 2005-026149

(51) Int. Cl.
*H01L 23/48* (2006.01)
(52) U.S. Cl. .................. 257/765; 257/781
(58) Field of Classification Search ............. 257/781, 257/765
See application file for complete search history.

(56) References Cited

U.S. PATENT DOCUMENTS 5,587,336 A * 12/1996 Wang et al. .................... 438/17
5,821,627 A * 10/1998 Mori et al. .................... 257/780
6,507,057 B1 * 1/2003 Ohno ........................... 257/257
7,049,214 B2 * 5/2006 Kawanabe et al. ........... 438/612

FOREIGN PATENT DOCUMENTS

JP          07-235659          9/1995

* cited by examiner

*Primary Examiner*—Thao X. Le
*Assistant Examiner*—Ajay K Arora
(74) *Attorney, Agent, or Firm*—RatnerPrestia

(57) ABSTRACT

An electrode contact structure having a high reliability is provided. The structure comprises an Au electrode formed on a GaAs substrate, a contact hole open in an insulating film on the Au electrode, and an Al wiring being in contact with the Au electrode through the contact hole. The difference between the height of the portion having the maximum thickness of the Al wiring and the height of the portion having the minimum thickness of the Al wiring is substantially equal to or smaller than the thickness of the insulating film. It is preferable that the thickness of the Au electrode is in the range of 0.1-0.2 μm, the overlapped width between the peripheral portion of the Au electrode and the insulating film is 1 μm or less, or the area of the contact hole is at least 16 μm² or more.

12 Claims, 11 Drawing Sheets

ELECTRODE CONTACT STRUCTURE

BACKGROUND OF THE INVENTION

1. Field of the Invention

The present invention relates to an electrode contact structure, particularly to a contact structure between an Au electrode and an Al wiring and a method for fabricating the same.

2. Related Art

As a material for an ohmic electrode coming in contact with a compound semiconductor used as an optical element of a light-emitting or light-receiving element, an alloy consisting essentially of Au is usually used. For example, AuGe, AuIn, AuSi and AuSn are used for a p-type electrode, and AuZn, AuMo, AuIn and AuBe for an n-type electrode. As a material for a wiring, Al is usually used, which has a low resistivity and is suitable for wire bonding.

However, in the combination of an alloy consisting essentially of Au and aluminum, Au—Al intermetallic compound are formed due to a counter diffusion of Au atoms and Al atoms in a contact hole opened in an $SiO_2$ insulating film in which an Au alloy and Al are ohmically contacted to each other. As Au—Al intermetallic compound, five kinds of compounds are known such as $Au_4Al$, $Au_5Al_2$, $Au_2Al$, $AuAl$ and $AuAl_2$ that are alloys of metastable composition. $Au_5Al_2$ has a specific volume which is three to four times a volume of sole Au or Al. That is, $Au_5Al_2$ is expanded three to four times in volume, so that stress is stored in a contact hole. As a result, an Al wiring and/or an insulating film are/is broken away to cause the breakage of a wiring, which has a bad influence upon the reliability of an electrode contact structure. Such an intermetallic compound $Au_5Al_2$ is formed at the peripheral portion of a contact hole, i.e., at the portion being in contact with an $SiO_2$ insulating film.

In the case that there are many contact holes in an array structure including a plurality of optical elements, especially in an array comprising a driver circuit such as a self-scanning light-emitting element array using three-terminal light-emitting thyristors of PNPN structure (see Japanese Patent No. 2683781), if the intermetallic compound $Au_5Al_2$ is formed, a plurality of contact holes, the number thereof being 3-10 times the number of light-emitting elements, the integrity of at least one contact hole is compromised.

SUMMARY OF THE INVENTION

An object of the present invention is to provide an electrode contact structure having a high reliability.

Another object of the present invention is to provide a method for fabricating the electrode contact structure.

A further object of the present invention is to provide a self-scanning light-emitting element array including the electrode contact structure.

A first aspect of the present invention is an electrode contact structure. The structure comprises an Au electrode, a contact hole open in an insulating film on the Au electrode, and an Al wiring being in contact with the Au electrode through the contact hole. It is preferable that the difference between the height of the portion having the maximum thickness of the Al wiring on the Au electrode and the height of the portion having the minimum thickness of the Al wiring on the Au electrode is substantially equal to or smaller than the thickness of the insulating film.

It is also preferable that the thickness of the Au electrode is in the range of 0.1-0.2 μm, the overlapped width between the peripheral portion of the Au electrode and the insulating film is 1 μm or less, or the area of the contact hole is at least 16 μm² or more.

An electrode contact structure in accordance with the present invention comprises an electrode consisting of $Au_4Al$ alloy, a contact hole open in an insulating film on the electrode, and an Al wiring being in contact with the electrode through the contact hole.

According to the present invention, the Au electrode is composed of a layer structure including an Au alloy film, a barrier metal film deposited on the Au alloy film, and an Au film deposited on the barrier metal film.

A second aspect of the present invention is a method for fabricating a method for fabricating an electrode contact structure including an Au electrode, a contact hole open in an insulating film on the Au electrode, and an Al wiring being in contact with the Au electrode through the contact hole. The method comprises the steps of depositing the Au electrode on a substrate, depositing the insulating film and opening the contact hole therein on the Au electrode, and depositing Al on the Au electrode by a sputtering process and changing the entire of the Au electrode to $Au_4Al$ by using an energy of sputtering.

Another method for fabricating an electrode contact structure comprises the steps of depositing an Au electrode consisting of $Au_4Al$ alloy on a substrate, depositing an insulating film and opening the contact hole therein on the Au electrode, and depositing Al on the Au electrode by a sputtering process.

A third aspect of the present invention a self-scanning light-emitting element array using three-terminal light-emitting thyristors each thereof being PNPN-structure. An electrode contact structure of the three-terminal light-emitting thyristors is the electrode contact structure in accordance with the present invention.

Figure 1A:
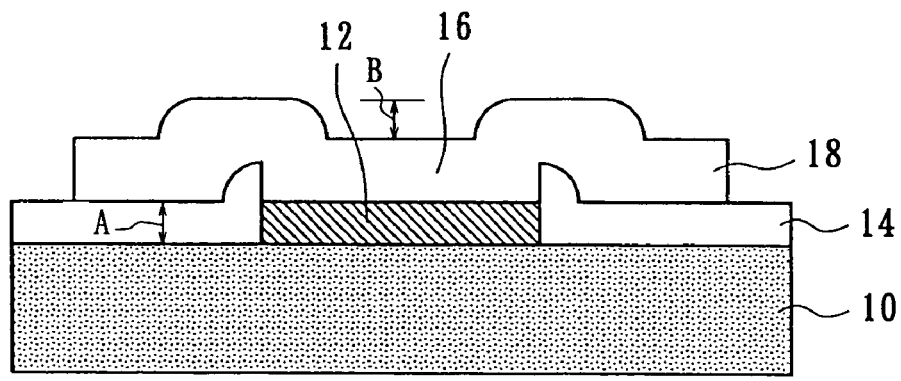
FIGS. 1A, 1B and 1C show cross sectional views of three types of electrode contact structure used for experiments.

BEST MODE FOR CARRYING OUT THE INVENTION $Au_4Al$ that is one of Au—Al intermetallic compounds has a specific volume of 1, so that the volume thereof is not approximately varied by the formation of an intermetallic compound. Accordingly, Au—Al intermetallic compound $Au_4Al$ having a small volume variation is preferentially formed to suppress the formation of Au—Al intermetallic compound $Au_5Al_2$ having a large volume variation (i.e., a large volume expansion).

In order to form $Au_4Al$, when an Al film is deposited on an Au electrode by sputtering, $Au_4Al$ is formed in an interface by using an energy of sputtering. The entire of the Au electrode under the deposited Al may be changed to $Au_4Al$ when the thickness of the Au electrode is suitably selected. Once $Au_4Al$ is formed, the migration of Au atoms from $Au_4Al$ to an Al film does not occur, and then $Au_5Al_2$ is not formed. Therefore, a volume expansion is not caused in a contact hole to maintain the integrity of the electrode contact structure. However, if the thickness of the Au electrode is thick, Au in the electrode remains without being alloyed.

In a conventional electrode contact structure, the edge of the Au electrode is outside a contact hole, accordingly $Au_4Al$ is not formed at the peripheral portion of the Au electrode outside the contact hole, so that Au remains at the peripheral portion. As a result, it is thought that Au atoms at the peripheral portion are diffused into the Al wiring by thermal hysteresis of the process such as the deposition of a protective film after the patterning of Al to form the intermetallic compound accompanying a volume expansion.

It is, therefore, required to design an electrode contact structure so that Au itself does not remain in the electrode as much as possible. For this purpose, the following methods may be considered.
(1) The thickness of an Au electrode is made as thin as possible.
(2) The area of a peripheral portion of an Au electrode covered by an insulating film is made as small as possible.
(3) The area of a contact hole is made as large as possible.
(4) An electrode itself is made of $Au_4Al$.

In the method (1), as the thickness of the Au electrode is thin, the entire of the Au electrode may be changed to $Au_4Al$. Even if Au remains in the electrode, the number of Au atoms to be diffused into an Al wiring is less, so that $Au_5Al_2$ is difficult to be formed.

In the method (2), the amount of Au remaining at the peripheral portion of the Au electrode may be less, so that $Au_xAl_2$ is difficult to be formed.

In the method (3), when the area of a contact hole becomes large, the volume ratio of Al with respect to Au in the contact hole becomes high, resulting in the decrease of a volume variation.

In the method (4), as the Au electrode itself is made of $Au_4Al$ from the beginning, $Au_5Al_2$ is difficult to be formed.

The following experiments were carried out to make sure of the effects of above-described respective methods.

Some samples was fabricated by forming an Au electrode on a GaAs semiconductor substrate, depositing an $SiO_2$ insulating film on the structure, and forming an Al wiring on the structure. Three types of Au electrodes were fabricated, i.e., the thickness thereof was 150 nm, and the areas thereof were 4 μm×4 μm, 6 μm×6 μm and 8 μm×8 μm, respectively.

The thickness of the $SiO_2$ insulating film was 150 nm, and the thickness of the Al wiring was 1.2 μm. The input power was about 400 $kW/m^2$ during an Al sputtering process. The size of the contact hole was 4 μm×4 μm.

The three types of samples were cut by a focusing ion beam etching (FIB) to observe the cross section of the contact hole by means of a scanning electron microscope (SEM).

Figure 1B:
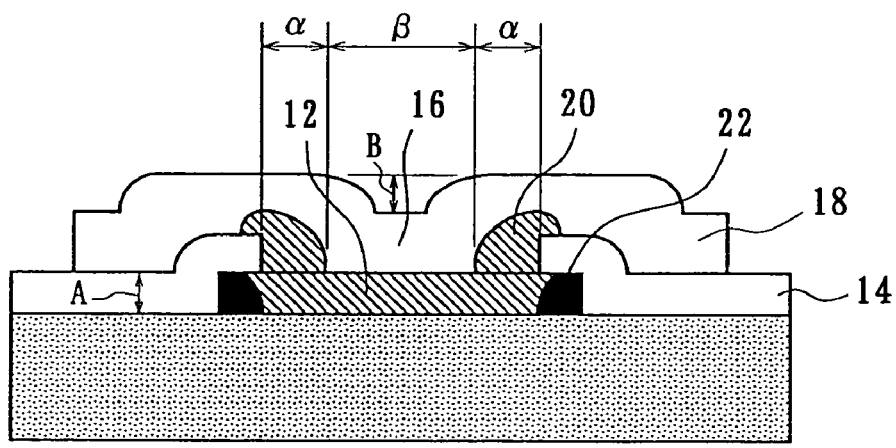
Figure 1C:
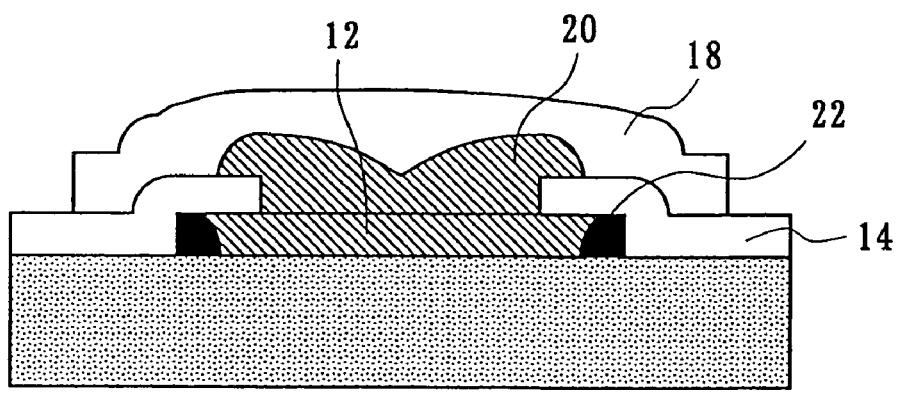

The schematic views of the cross sections of three types of contact holes are shown in FIGS. 1A, 1B and 1C, respectively. In the figures, reference numeral 10 shows a GaAs substrate, 12 an Au electrode, 14 an $SiO_2$ insulating film, 16 a contact hole, 18 an Al wiring, 20 a formed Au—Al intermetallic compound $Au_5Al_2$. In an SEM photograph, the boundary between Au and the formed Au—Al intermetallic compound was not distinguished, but the boundary between the formed Au—Al intermetallic compound and Al could be clearly distinguished.

In the cross sectional view of the electrode contact structure shown in FIG. 1A in which the area (4 μm×4 μm) of the contact hole 16 and the area (4 μm×4 μm) of the Au electrode 12 were the same, the thickness of the Au electrode 12 was substantially the same as that of the Au electrode prior to Al sputtering, i.e., was 150 nm. It is recognized from the composition analysis that the Au electrode consists of not pure Au but intermetallic compound with Al, i.e., $Au_4Al$.

It is appreciated that when the thickness of the Au electrode is thin such as 150 nm, substantially entire of the Au electrode may be changed to $Au_4Al$.

The thickness A of the $SiO_2$ insulating film 14 and the difference B between the height of the portion having the maximum thickness of the Al wiring 18 on the Au electrode and the height of the portion having the minimum thickness of the Al wiring 18 on the Au electrode 18 were measured. The thickness A was 150 nm and the height difference B was 160 nm. As the measurement error was 10%, the thickness A and the height difference B were substantially the same. It is noted that each the values A and B was an average value for two or more measuring points, respectively.

Next, in the cross sectional view of the electrode contact structure shown in FIG. 1B in which the area (6 μm×6 μm) of the Au electrode 12 were larger than the area (4 μm×4 μm) of the contact hole 16, the edge portion of the Au electrode 12 under the $SiO_2$ insulating film 14 became a cavity 22, and an intermetallic compound 20 of $Au_5Al_2$ was grown of the peripheral portion of the contact hole 16. Herein, the cavity 22 was recognized as a Kirkendall cavity which was formed because that the diffusion of Au atoms in Al was faster than the diffusion of Al atoms in Au.

The thickness A of the $SiO_2$ insulating film 14 and the height difference B between the height of the portion having the maximum thickness of the Al wiring 18 on the Au electrode 12 and the height of the portion having the minimum thickness of the Al wiring 18 on the Au electrode 12 were measured. The thickness A was 150 nm and the height difference B was 140 nm.

There were the portion (the portion β in FIG. 1B) consisting essentially of Al and the portion (the portion α in FIG. 1B) including Au—Al intermetallic compound and Al.

Next, in the cross sectional view of the electrode contact structure shown in FIG. 1C in which the area (8 μm×8 μm) of the Au electrode 12 were larger than the area (4 μm×4 μm) of the contact hole 16, it was appreciated that the volume of the intermetallic compound ($Au_5Al_2$) 20 was further increased.

The thickness A of the $SiO_2$ insulating film 14 and the difference B between the height of the portion having the maximum thickness of the Al wiring 18 on the Au electrode 12 and the height of the portion having the minimum thickness of the Al wiring 18 on the Au electrode 12 were measured. The thickness A was 150 nm and the height difference B was −400 nm (the height portion having the minimum thickness of the Al wiring was increased by 400 nm from the height of the portion having the maximum thickness of the Al wiring).

It is appreciated from the results above described that the smaller the peripheral portion of the Au electrode covered by the $SiO_2$ insulating film, the less the amount of formed $Au_5Al_2$ becomes. It is also appreciated that $Au_5Al_2$ is not formed when the thickness of the Au electrode is small in the case that the area of the Au electrode and the area of the contact hole are the same.

When the volume expansion is not caused, the values A and B are substantially the same as shown in FIGS. 1A and 1B. In this case, an electrode having a high integrity may be realized. Even if $Au_5Al_2$ is formed, failures are not caused when the value of B is positive.

Experiments were further carried out with the sizes of components of the electrode contact structure being varied. The results of the experiments will now be explained.

Figure 2A:
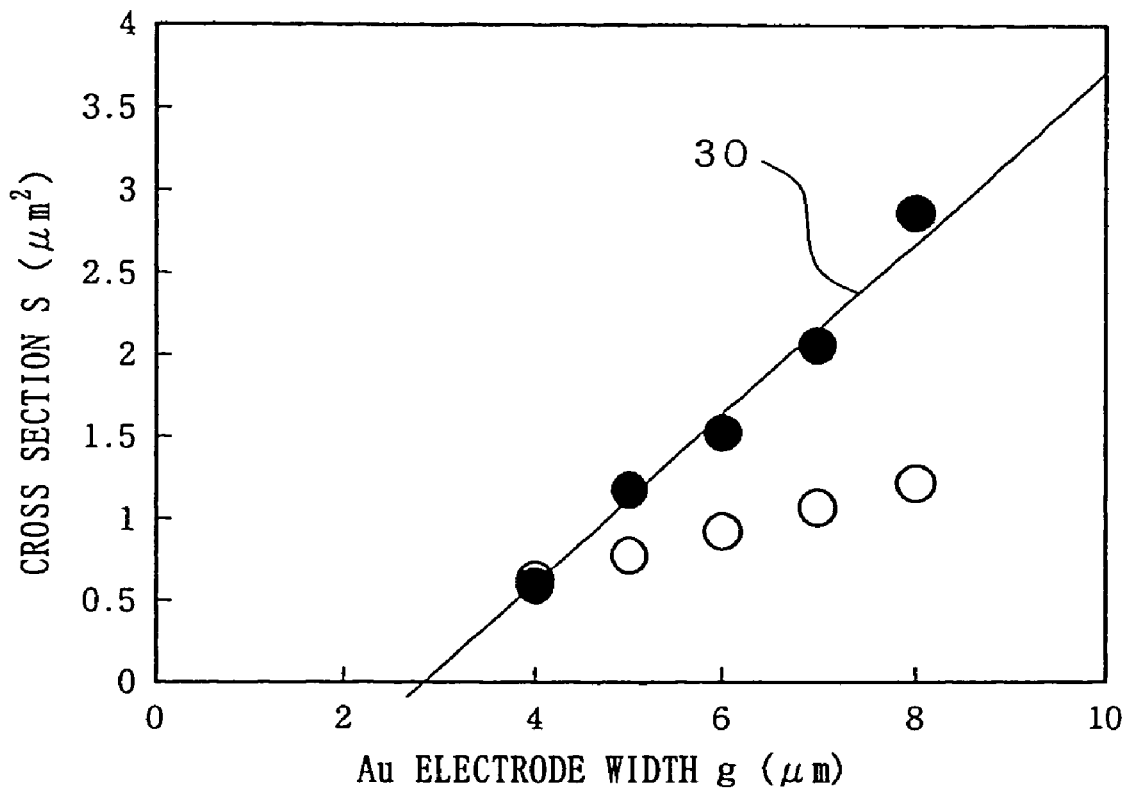
FIGS. 2A and 2B show an experimental result with the overlapped width varied and the electrode contact structure used in the experiment.
Figure 2B:
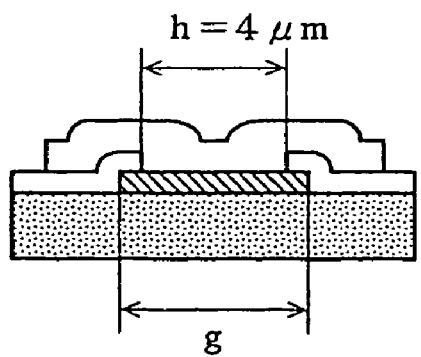

In FIG. 2A, there is shown a graph which illustrates the relation between the areas of cross sections of the Au electrode and Au—Al intermetallic compound and the area of the Au electrode. FIG. 2B shows the cross sectional view of the electrode contact structure. The are of the Au electrode is represented by g×g, and the area of the contact hole h×h (h=4 μm). In the graph shown in FIG. 2A, abscissa designates the width g of the Au electrode (corresponding to the area thereof) and ordinate the area of a cross section of each of the Au electrode and Au—Al intermetallic compound. Mark ○ designates the area of the cross section of the Au electrode (design values), and mark ● the area of the cross section of the Au—Al intermetallic compound (including the area of a cavity).

It may be recognized from the graph that the area of the Au electrode being in contact with the sputtered Al wiring in the contact hole is not varied, and Au in the peripheral portion of the Au electrode outside the contact hole are diffused into the Al wiring to form Au—Al intermetallic compound, the area of cross section thereof being three times that of the original Au. This recognition is matched to the straight line 30 shown in the graph and may be utilized for illustrating the experiment results.

Figure 3A:
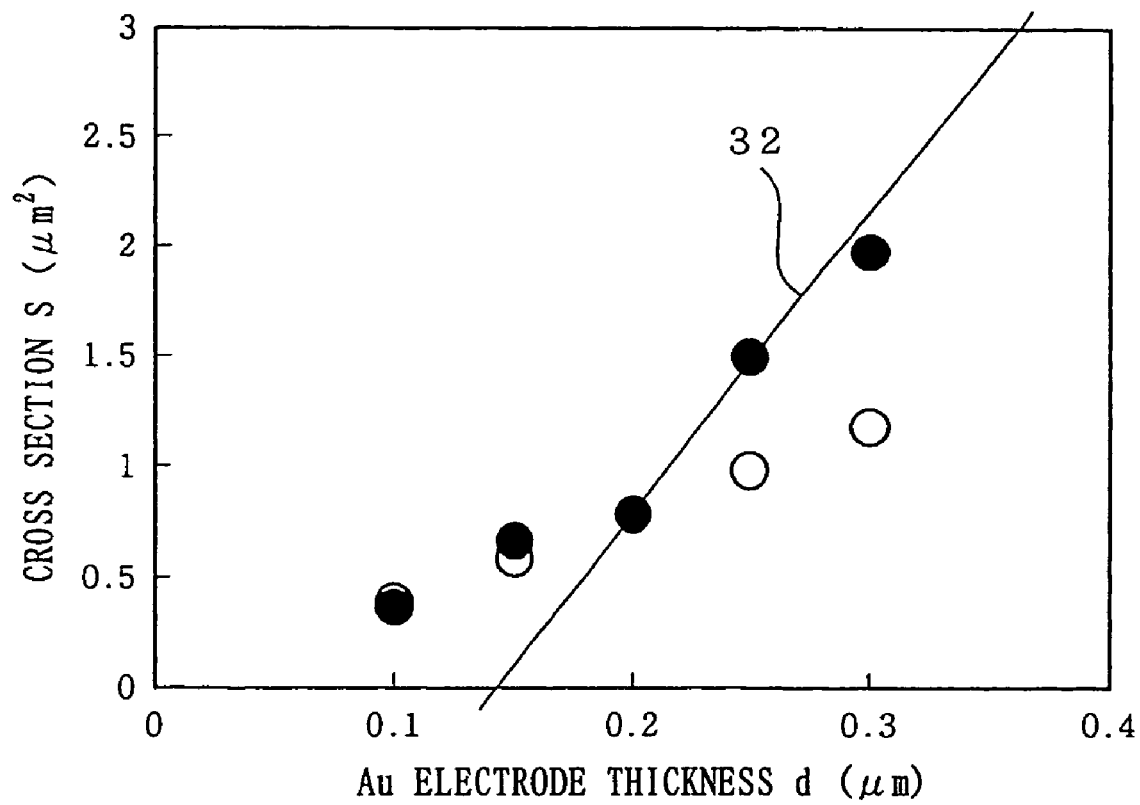
FIGS. 3A and 3B show an experimental result with the thickness of the Au electrode varied and the electrode contact structure used in the experiment.
Figure 3B:
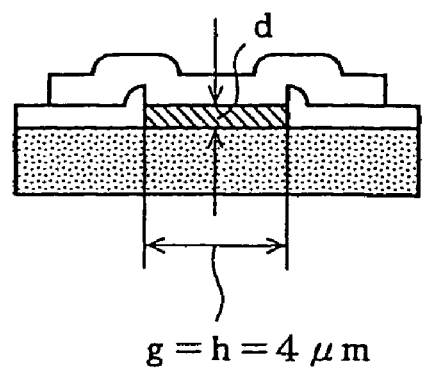

FIG. 3A shows the areas of cross sections of the Au electrode and Au—Al intermetallic compound when the thickness d of the Au electrode was varied with being the area of the Au electrode=the area of the contact hole=4 μm×4 μm. FIG. 3B shows the cross sectional view of the electrode contact structure. The thickness d of the Au electrode is shown in the figure. In the graph shown in FIG. 3A, abscissa designates the thickness d of the Au electrode and ordinate the area of a cross section of each of the Au electrode and Au—Al intermetallic compound. Mark ○ designates the area of the cross section of the Au electrode (design values), and mark ● the area of the cross section of the Au—Al intermetallic compound.

It may be recognized from the graph that the part of the Au electrode corresponding the 0.2 μm thick toward the Al wiring was changed to $Au_4Al$ and the residue of the Au electrode remains as it is, and Au atoms are diffused through a succeeded heat processing from the remained portion into the Al wiring to form $Au_5Al_2$ the volume thereof is expanded three to four times that of the original Au. This recognition is matched to the straight line 32 shown in the graph and may be utilized for illustrating the experiment results.

Figure 4A:
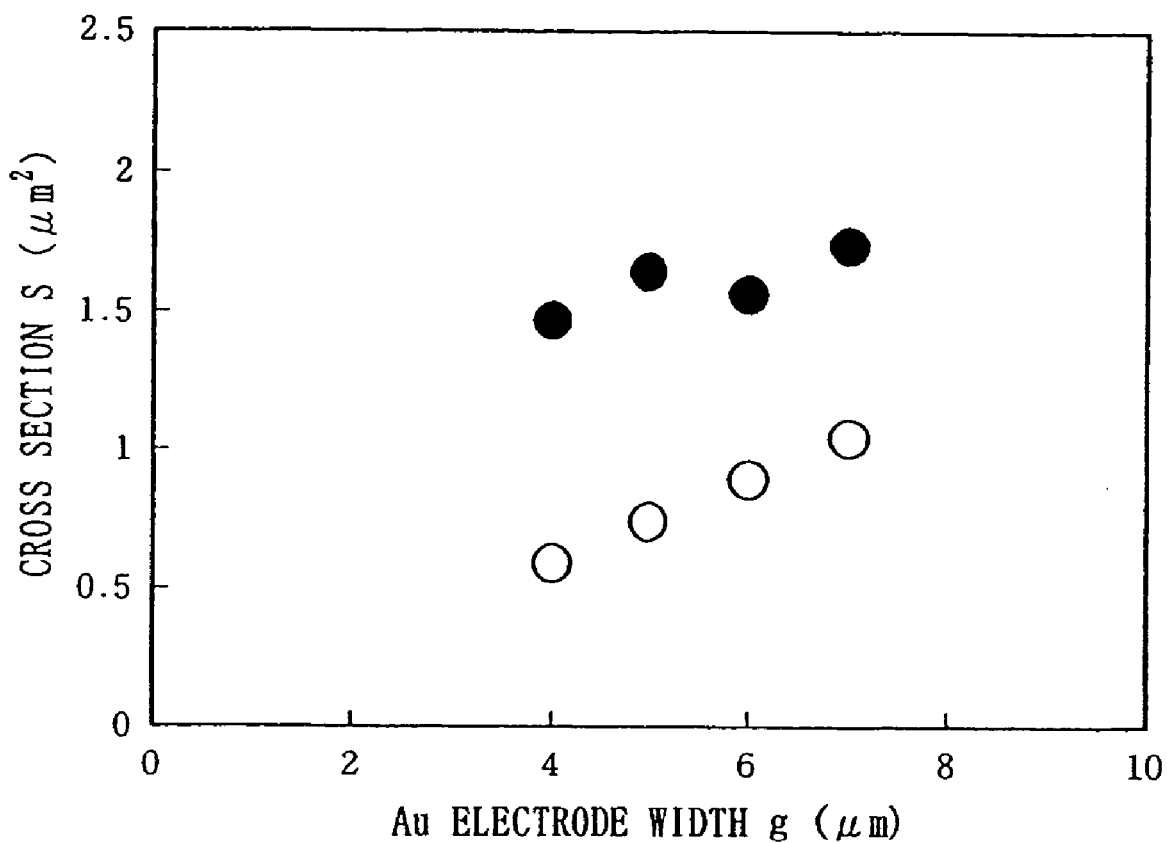
FIGS. 4A and 4B show an experimental result with the area of the contact hole varied and an electrode contact structure sued in the experiment.
Figure 4B:
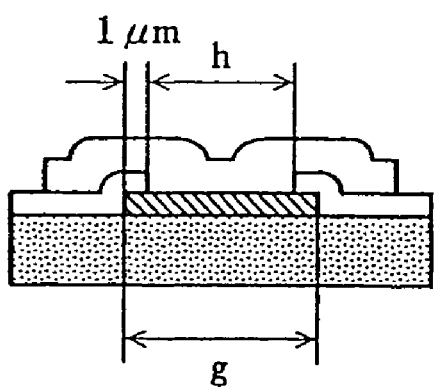

In FIG. 4A, there is shown a graph which illustrates the relation between the area of a cross section of the Au electrode and the areas of cross section of the Au electrode and Au—Al intermetallic compound. The thickness of the Au electrode was 150 nm. FIG. 4B shows the cross sectional view of the electrode contact structure. In the graph shows in FIG. 4A, abscissa designates the width g of the Au electrode (corresponding to the area thereof) and ordinate the area of a cross section of each of the Au electrode and Au—Al intermetallic compound. Mark ○ designates the area of the cross section of the Au electrode (design values), and mark ● the area of the cross section of the Au—Al intermetallic compound (including the area of a cavity).

It is appreciated in this graph that the larger the area of the Au electrode, the larger the area of the cross section of the Au—Al intermetallic compound become. However, the area of the contact hole is also increased, so that the expansion coefficient becomes small as the area of the Au electrode is increased (i.e., the areas of the contact hole is increased). As a result, the reliability of the electrode contact structure is improved.

An accelerating degradation test by PCT (Pressure Crack Test) was carried out for various designs of electrode contact structure to determine the failure rate thereof. The number of sample every design was 2,560, and the test conditions were 136° C., 90% RH and 100 hours. The test results are shown in FIGS. 5A and 5B to FIGS. 7A and 7B.

Figure 5A:
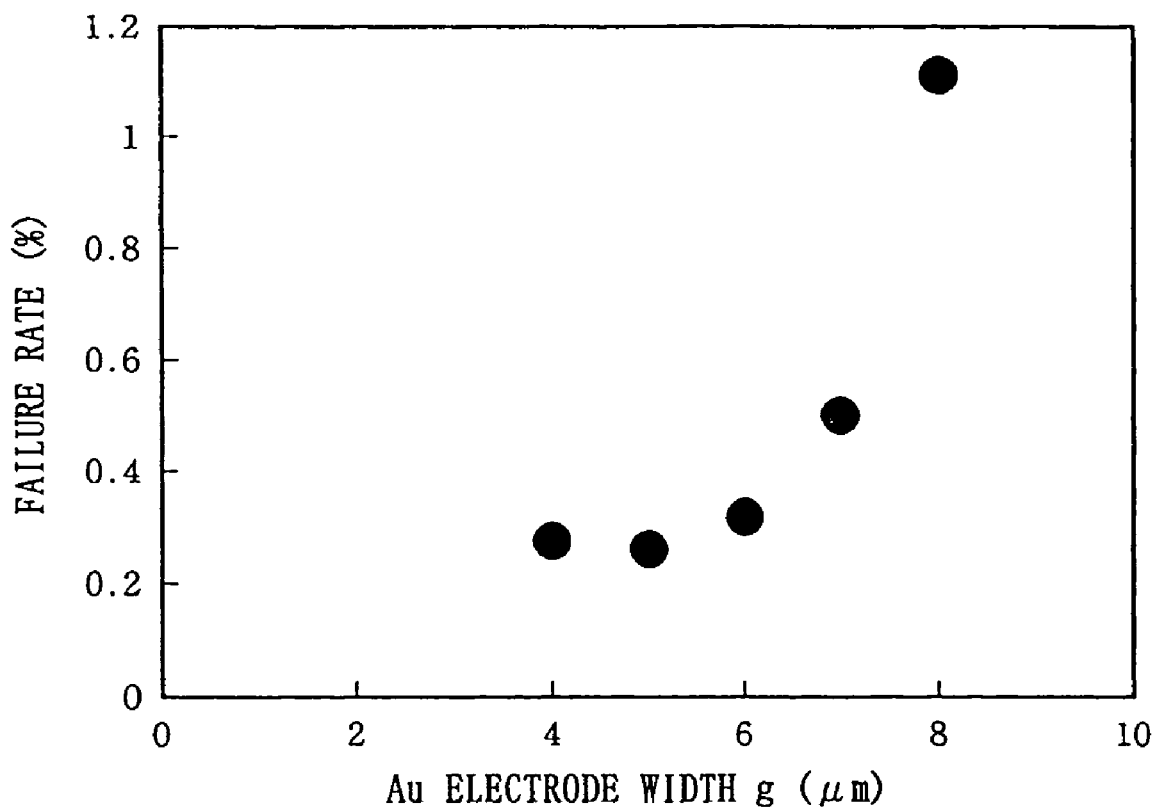
FIGS. 5A and 5B show an experimental result with the overlapped width varied and the electrode contact structure used in the experiment.
Figure 5B:
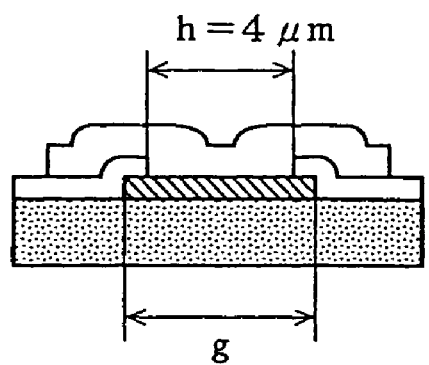

FIGS. 5A and 5B show the failure rate with the area of the Au electrode being varied when the areas of the contact hole is 4 μm×4 μm as in FIGS. 2A and 2B.

Figure 6A:
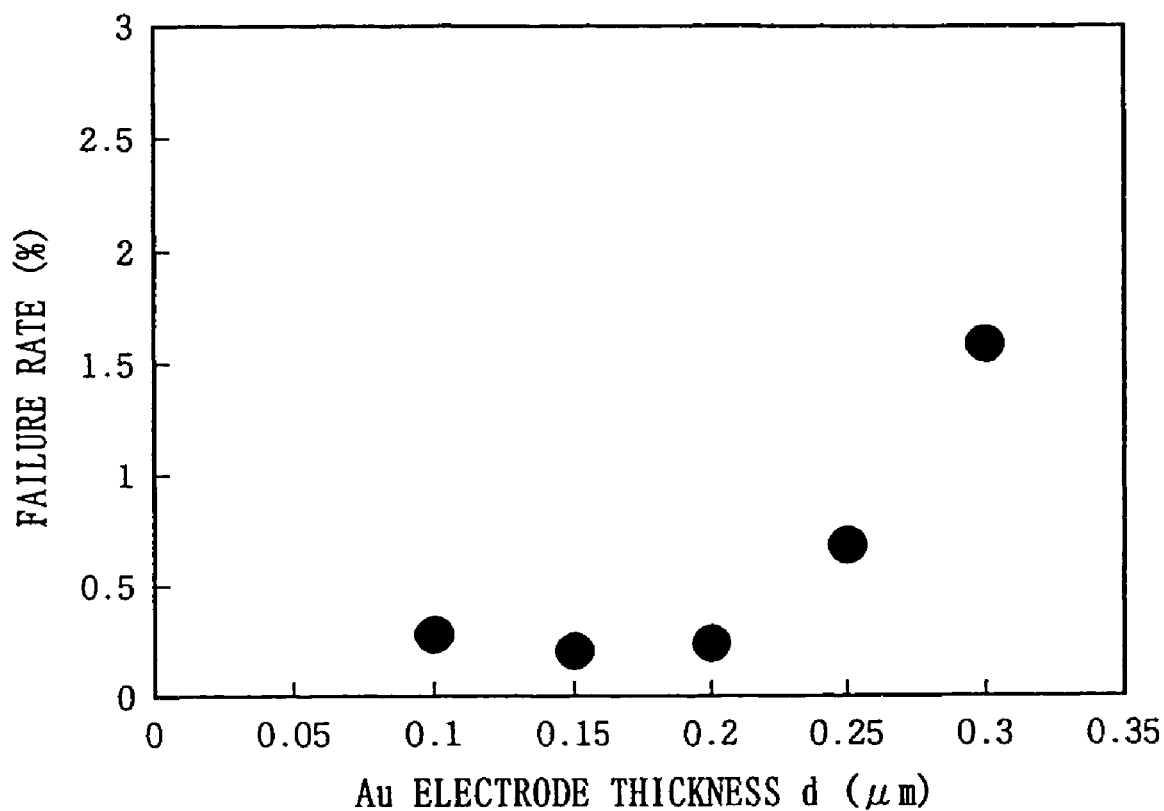
FIGS. 6A and 6B show an experimental result with the thickness of the Au electrode varied and the electrode contact structure used in the experiment.
Figure 6B:
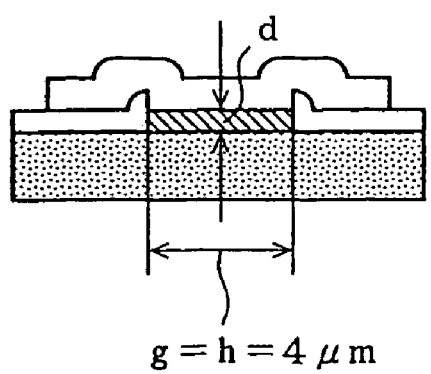

FIGS. 6A and 6B show the failure rate with the thickness d of the Au electrode being varied when the areas of the contact hole and Au electrode are the same as in FIGS. 3A and 3B.

Figure 7A:
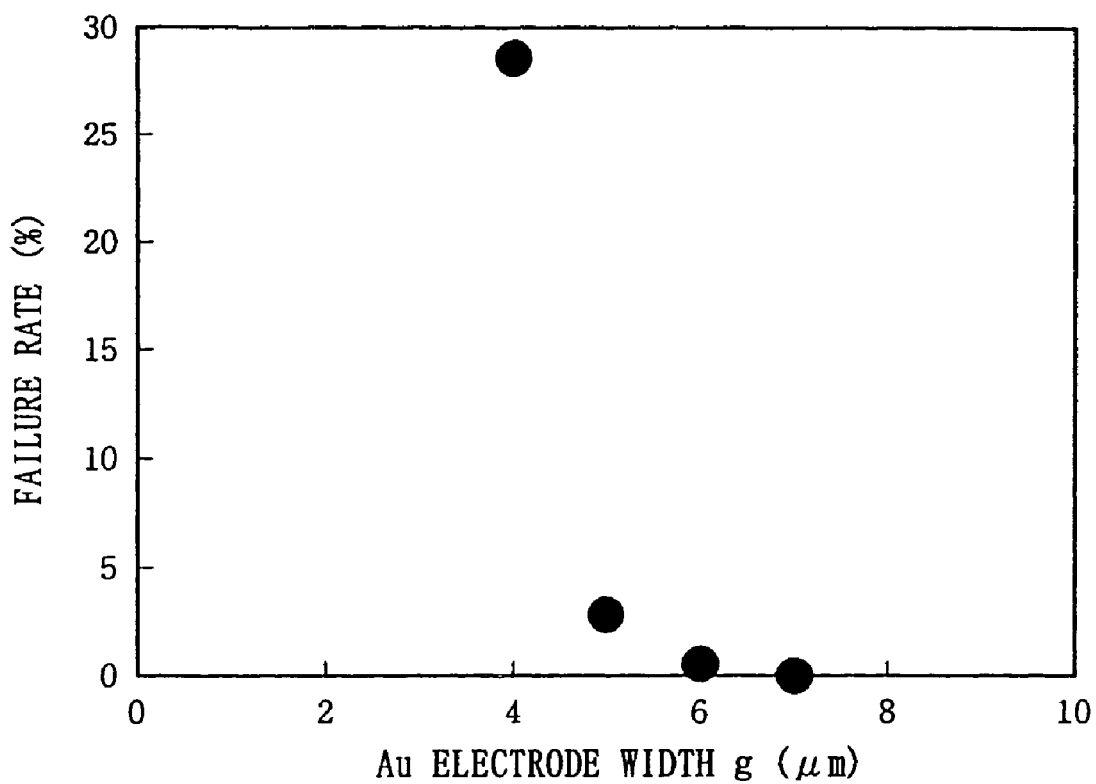
FIGS. 7A and 7B show an experimental result with the area of the contact hole varied and an electrode contact structure used in the experiment.
Figure 7B:
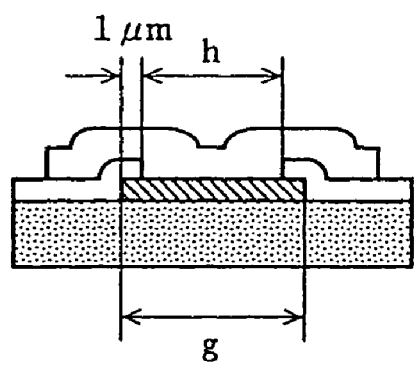

FIGS. 7A and 7B show the failure rate with the area of the Au electrode being varied when the overlapped width between the peripheral portion of the Au electrode and the insulating film is 1 μm.

Figure 8A:
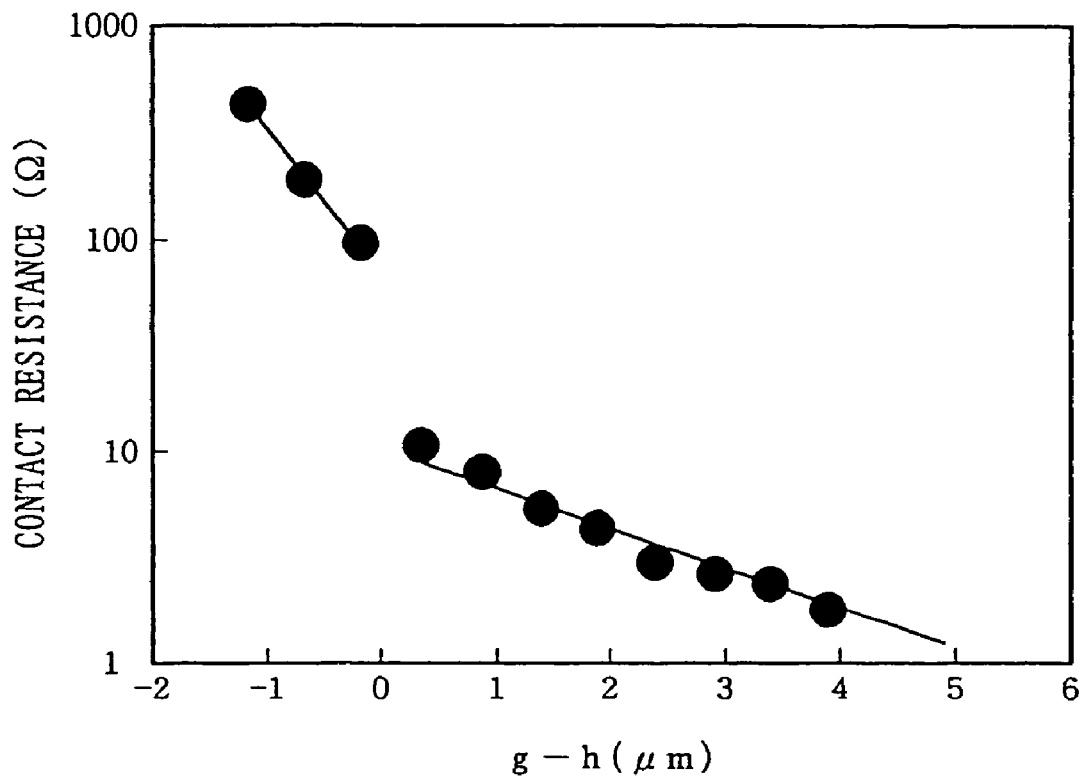
FIGS. 8A and 8B show the variation of a contact resistance with the overlapped width varied and the electrode contact structure used in the experiment.
Figure 8B:
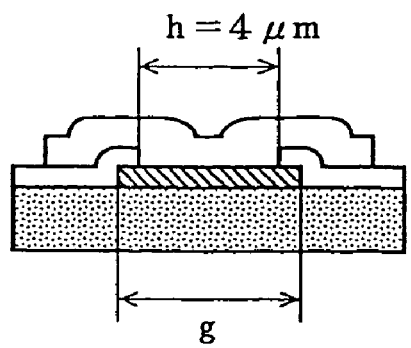

It is appreciated from the test results shown in FIGS. 5A and 5B that the failure rate in the case that the overlapped width between the peripheral portion of the Au electrode and the insulating film is 0.5 μm is the same as that in the case that the overlapped width is 0. It is understood that the failure rate is small even if the overlapped width is 1 μm. On the other hand, the contact resistance between the Au electrode and the GaAs substrate is shown in FIGS. 8A and 8B. It is appreciated in FIGS. 8A and 8B that the contact resistance is extremely increased when the overlapped width is smaller than 0. Therefore, it is desirable that the overlapped width necessarily be designed so as to be larger than 0.

Figure 9A:
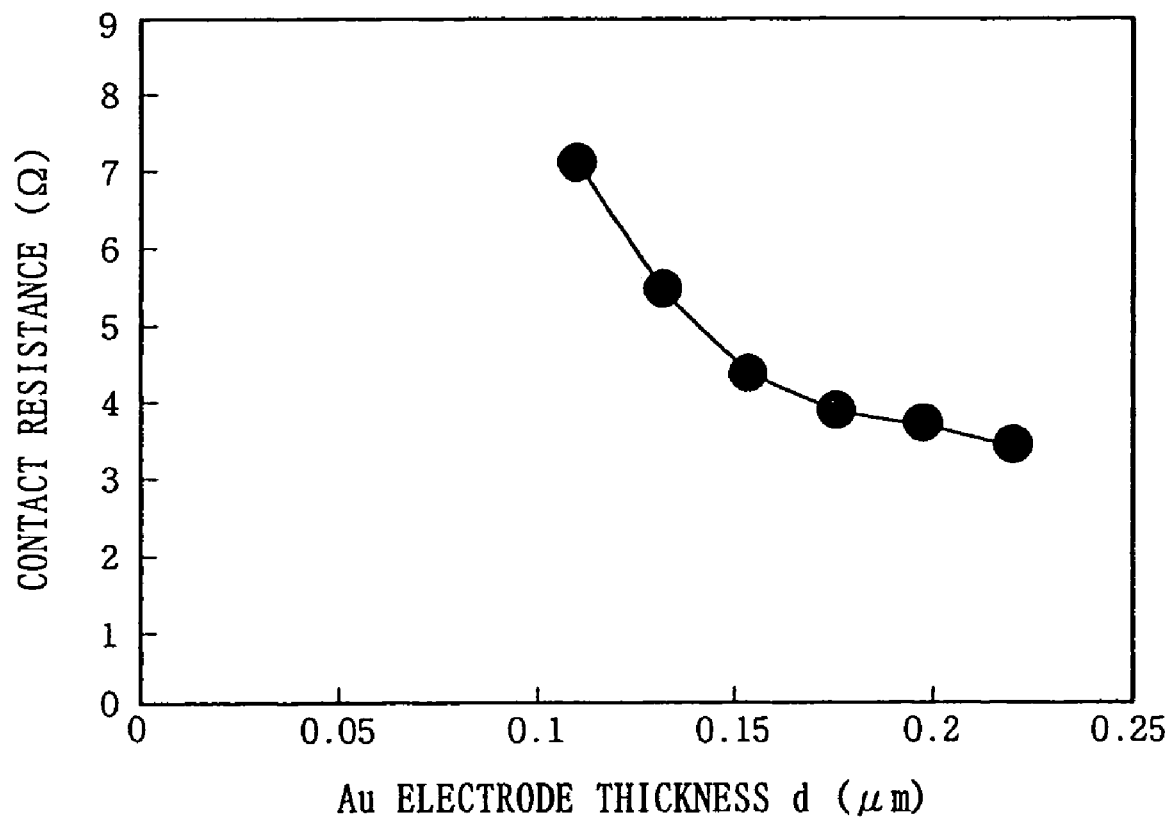
FIGS. 9A and 9B show the variation of a contact resistance with the thickness of the Au electrode varied and the electrode contact structure used in the experiment.
Figure 9B:
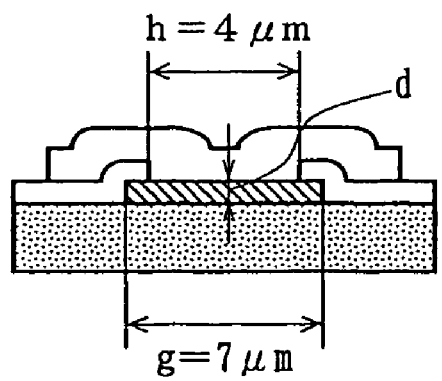

It is appreciated from the test results shown in FIGS. 6A and 6B that the failure rate is low when the thickness d of the Au electrode is 0.2 μm (200 nm) or less. On the other hand, it is understood that the contact resistance between the Au electrode and the GaAs substrate has a tendency to be higher as the thickness of the Au electrode is decreased. It is appreciated from FIGS. 9A and 9B showing the contact resistance between the Au electrode and the GaAs substrate that the contact resistance where the thickness of the Au electrode is 0.1 μm is two times that where the thickness of the Au electrode is 0.2 μm. It is also understood that the contact resistance is extremely increased and the dispersion thereof is also increased in the case that the thickness of the Au electrode is thinner than 0.2 μm.

It is appreciated from the test results shown in FIGS. 7A and 7B that in the case that the overlapped width between the peripheral portion of the Au electrode and the insulating film is fixed (i.e., 1 μm), the failure rate is extremely low where the area of the contact hole is 4×4=16 μm², and the failure rate is 0 where the area of the contact hole is 5×5=25 μm². On the other hand, the failure rate is extremely increased where the area of the contact hole is 3×3=9 μm² or less.

It is, therefore, understood from the results described above that the failure rate of the samples having a large area of the cross section of the Au—Al intermetallic compound in FIGS. 2A, 2B-FIGS. 4A, 4B is high.

The following results are obtained from the experiments above described.

(1) The overlapped width between the peripheral portion of the Au electrode and the insulating film is preferably 1 μm or less, more preferably 0.5 μm or less. Also, the overlapped width is preferably larger than 0.
(2) The thickness of the Au electrode is preferably in the range of 0.1-0.2 μm.
(3) The area of the contact hole is preferably 16 μm² or more, more preferably 25 μm² or more.

In order to decrease the effect of the peripheral portion of the Au electrode covered by the insulating film, the shape of the Au electrode and the contact hole may be not only square but also circular, ellipsoidal and elliptical. In the case of square, the overlapped portion between the Au electrode and the insulating film at the corner of the contact hole is larger than that at the portion except the corner, so that the corner portion tends to be damaged. However, in the case that the shape is circular, the overlapped portion around the entire peripheral portion of the contact hole is uniform, resulting in the improvement for the reliability of the electrode contact structure.

In order to decrease the effect of the overlapped portion, the Au electrode may be made of $Au_4Al$ from the first. An $Au_4Al$ film may be formed by sputtering process using an $Au_4Al$ alloy target, or by sputtering Al of 50 nm thick or more on the Au electrode of 200 nm thick or less.

It is preferable that the present invention is applied to all of the electrode contact structures on a chip. However, even if there are some electrode contact structures that do not satisfy with the condition of the present invention, a reliability corresponding to the percentage of electrode contact structures that satisfy with the condition of the present invention may be obtained, because the failure of an electrode contact structure is understood as an accidental failure so that the failed electrode contact structures are not bottlenecked. In general, it is required that half or more of electrode contact structures in a chip satisfy with the condition of the present invention.

While the example has been illustrated in which the Al wiring is not made of Al alloy, a wiring may be made of Al alloy including a small quantity of Si, Cu, Ni, Cr, Ti, Ta, Sc and the like.

In order to avoid the volume expansion due to the formation of Au—Al intermetallic compound, it is preferable that the amount of Au being in contact with Al is caused to be little. This may be realized by forming the Au electrode as the layer structure consisting of an Au alloy film, a barrier metal film and an Au film.

Figure 10A:
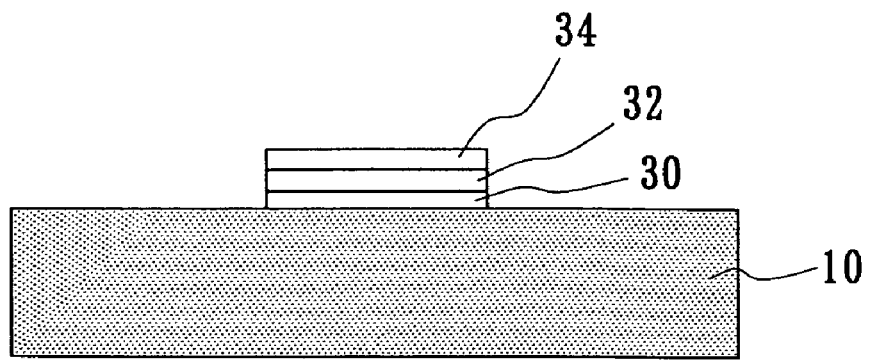
FIGS. 10A, 10B and 10C show an example in which the Au electrode is composed of a layer structure.
Figure 10B:
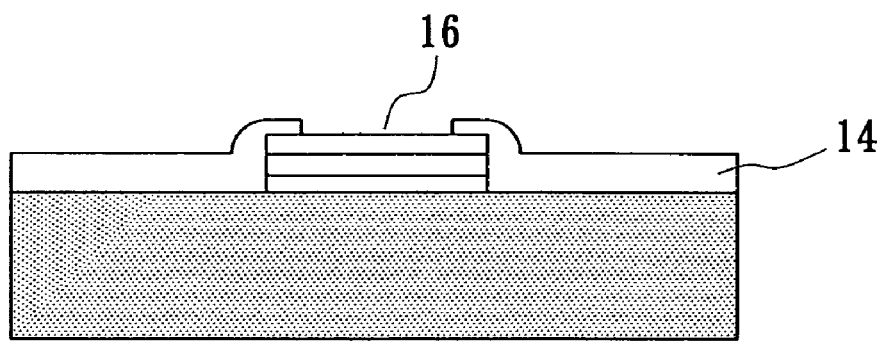
Figure 10C:
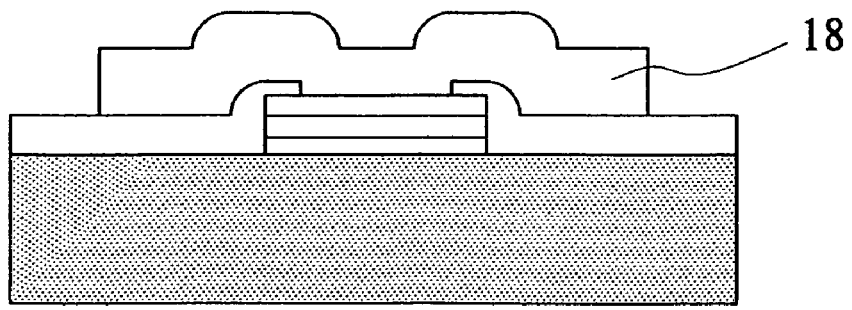

FIGS. 10A, 10B and 10C show an example of the layer structure. As shown in FIG. 10A, an Au alloy film 30 is vapor deposited on a GaAs substrate 10. The Au alloy film may ensure an ohmic contact to the substrate. A barrier metal film 32 is subsequently vapor deposited. A metal is selected as the barrier metal such that an intermetallic alloy or alloy causing unwanted phenomena such as the volume expansion or the resistance increasing due to the reaction of Au and Al is not formed. Refractory metals such as Cr, Ni, Pt, Ti and the like are usually selected. In this example, Cr of 10 nm thick was used. Subsequently, Au of 20 nm thick was deposited to form an Au film 34.

It was preferable to select the thickness of the Au film in the range of 5 nm-0.1 μm, because the volume expansion which is the reason of a failure was not caused. Thereafter, the Au alloy film 30 and barrier metal film 32 were patterned to form an electrode by a lift-off process.

An $SiO_2$ insulating film 14 was subsequently deposited by a plasma CVD and then a contact hole was opened therein by a reactive ion etching process (RIE) as shown in FIG. 10B. An Al film of 1.2 μm thick was deposited by a sputtering process and then the film was patterned to form an Al wiring 18 as shown in FIG. 10C.

Observing the cross section of the contact hole according to the electrode contact structure manufactured by the above-described steps, the volume expansion due to the Au—Al alloy was not found out.

The electrode contact structure in accordance with the present invention is preferably applicable to a self-scanning light-emitting element array using three-terminal light-emitting elements of PNPN-structure. One example of such self-scanning light-emitting element array disclosed in Japanese Patent No. 2683781 is shown in FIG. 11.

The self-scanning light-emitting element array comprises a switch element array including a plurality switch elements each having a first control electrode to control a threshold voltage or current for a switching operation, the first control electrodes neighbored to each other being connected through a first electric means, a power supply line being connected to respective switch elements through respective second electric means, and clock lines for transferring information being connected to respective switch elements; a light-emitting element array including a plurality of light-emitting elements each having a second control electrode to control a threshold voltage or current for a light-emitting operation, a line for supplying a current to light on a light-emitting element being connected to respective light emitting elements, and a signal for writing information being supplied to a part of the plurality of switch elements; a third electric means for connecting the first control electrode of the switch element to the second control electrode of the light-emitting element. ON/OFF state information stored in the switch element array is written into the light-emitting element array, and the ON/OFF state information written into the light-emitting element array is held for a desired time duration.

Figure 11:
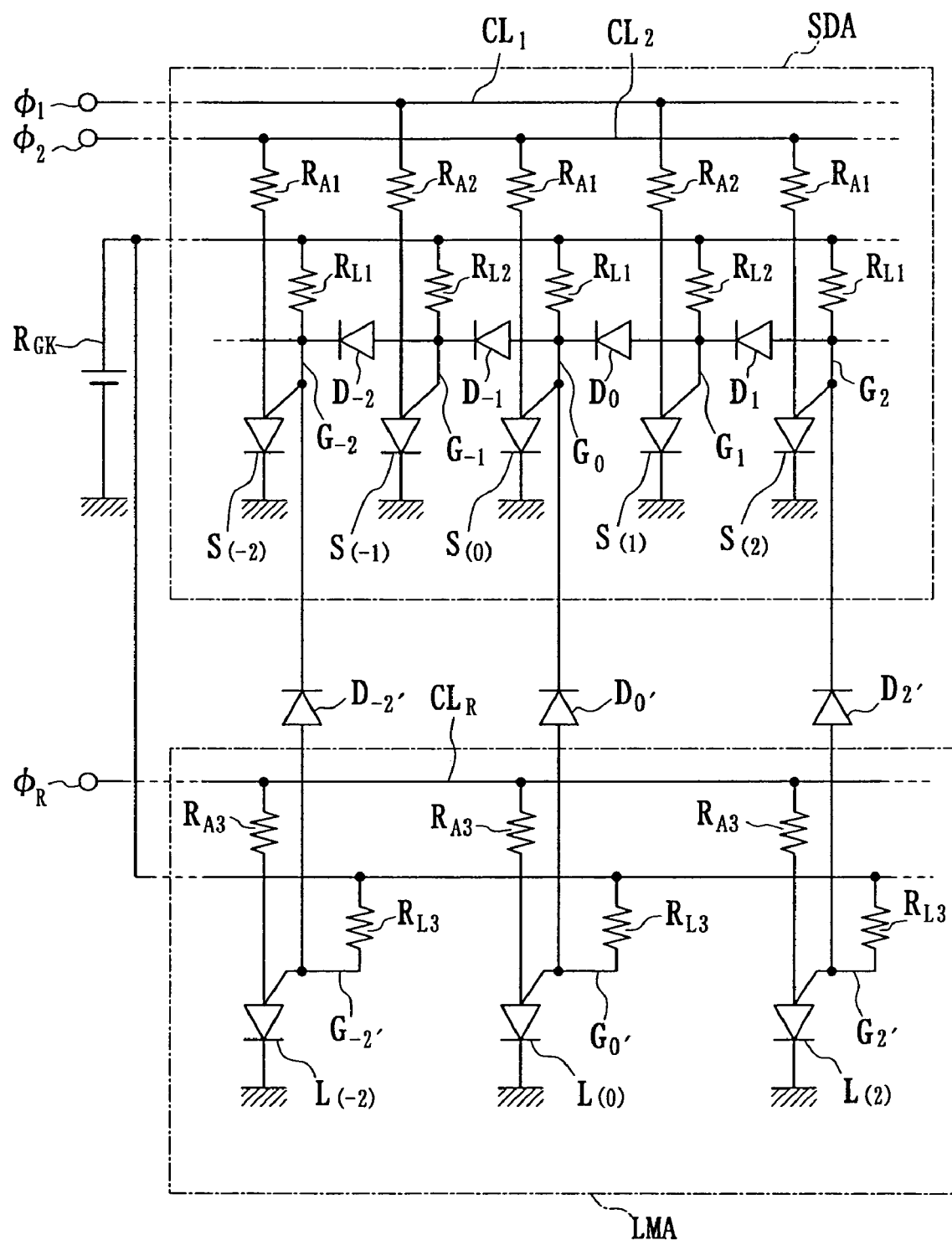
FIG. 11 shows an equivalent circuit diagram of a self-scanning light-emitting element array.

In FIG. 11, S designates the switch element, G a gate electrode that is the first control electrode, D a diode that is the first electric means, $V_{GK}$ the power supply line, $R_{L1}$, $R_{L2}$ resistors that are the second electric means, $C_{L1}$ the clock line to which clock $\phi_1$ is supplied, and $C_{L2}$ the clock line to which clock $\phi_2$ is supplied.

Anode electrodes of respective switch elements are alternatively connected to the clock lines $C_{L1}$ and $C_{L2}$ through the resistors $R_{A1}$ and $R_{A2}$.

L designates the light-emitting element, G is a gate electrode that is the second control electrode, $CL_R$ a line for supplying a current $\phi_R$, and D' the third electric means.

Anode electrodes of respective light-emitting elements are connected to the current supply line $CL_R$ through the resistors $R_{A3}$.

In the self-scanning light-emitting element array thus structured, it is preferable that the electrode contact structure in accordance with the present invention is used for the electrodes of the switch element S and light-emitting element L each consisting of a three-terminal light-emitting thyristor of PNPN-structure.

The invention claimed is:
1. An electrode contact structure, comprising:
a substrate;
an $Au_4Al$ electrode formed on the substrate;
an insulating film formed on the substrate and the $Au_4Al$ electrode;

a contact hole opened in the insulating film on the $Au_4Al$ electrode; and an Al wiring being in contact with the $Au_4Al$ electrode through the contact hole;

wherein the $Au_4Al$ electrode and the Al wiring form a structure consisting essentially of $Au_4Al$ to the substantial exclusion of Au and $Au_5Al_2$ and which includes means for suppressing formation of $Au_5Al_2$.

2. An electrode contact structure according to claim 1 wherein the $Au_4Al$ electrode has a thickness in a range of 0.1-0.2 µm.

3. An electrode contact structure according to claim 1 wherein an overlap in width between a peripheral portion of the $Au_4Al$ electrode and the insulating film is 1 µm or less.

4. An electrode contact structure, according to claim 1, wherein the contact hole has an area of at least 16 µm².

5. The electrode contact structure according to claim 2, 3 or 4, wherein the shape of the $Au_4Al$ electrode is square, circular, ellipsoidal or elliptical.

6. An electrode contact structure according to claim 1, wherein a difference in height between a thickest portion of the Al wiring on the $Au_4Al$ electrode and a thinnest portion of the Al wiring on the $Au_4Al$ electrode is substantially equal to or smaller than a thickness of the insulating film.

7. An electrode contact structure, comprising:

a substrate an electrode consisting of $Au_4Al$ formed on the substrate;

an insulating film formed on the substrate and the electrode;

a contact hole opened in the insulating film on the electrode; and an Al wiring being in contact with the electrode through the contact hole.

8. An electrode contact structure comprising:

a substrate;

an Au electrode, formed on the substrate, the Au electrode being composed of a layer structure including an Au film, a barrier metal film deposited on the Au film, and an $Au_4Al$ film formed on the barrier metal film;

an insulating film formed on the substrate and the Au electrode;

a contact hole opened in the insulating film on the Au electrode; and an Al wiring being in contact with the $Au_4Al$ film of the Au electrode through the contact hole;

wherein the layer structure has a total thickness in the range of 0.1-0.2 µm.

9. An electrode contact structure according to claim 8 wherein an overlap in width between a peripheral portion of the Au electrode and the insulating film is 1 µm or less.

10. An electrode contact structure according to claim 8 wherein the contact hole has an area of at least 16 µm².

11. The electrode contact structure according to claim 8, 9 or 10, wherein the barrier metal film consists of a refractory metal.

12. A self-scanning light-emitting element array using three-terminal light-emitting thyristors each thereof being PNPN-structure, wherein an electrical contact structure of the three-terminal thyristor comprises the electrode contact structure according to any one of claims 1, 2, 3, 4, 7, 8, 9 or 10.

* * * * *